United States Patent [19]
Cabral, Jr. et al.

[11] Patent Number: 5,625,233
[45] Date of Patent: Apr. 29, 1997

[54] THIN FILM MULTI-LAYER OXYGEN DIFFUSION BARRIER CONSISTING OF REFRACTORY METAL, REFRACTORY METAL ALUMINIDE, AND ALUMINUM OXIDE

[75] Inventors: Cyril Cabral, Jr., Ossining; Evan G. Colgan, Suffern; Alfred Grill, White Plains, all of N.Y.

[73] Assignee: IBM Corporation, Armonk, N.Y.

[21] Appl. No.: 372,633

[22] Filed: Jan. 13, 1995

[51] Int. Cl.⁶ .......................... H01L 23/482; H01L 29/45
[52] U.S. Cl. .............................. 257/771; 257/295
[58] Field of Search ........................ 257/771, 295

[56] References Cited

U.S. PATENT DOCUMENTS

| | | | |
|---|---|---|---|
| 5,015,440 | 5/1991 | Bowden | 419/31 |
| 5,313,101 | 5/1994 | Harada et al. | 257/771 |
| 5,355,020 | 10/1994 | Lee et al. | 257/741 |
| 5,421,974 | 6/1995 | Witt | 204/192.25 |

FOREIGN PATENT DOCUMENTS

| | | | |
|---|---|---|---|
| 61-214553 | 9/1986 | Japan | 257/771 |
| 3-99471 | 4/1991 | Japan | 257/771 |

OTHER PUBLICATIONS

Tantalum as a Diffusion Barrier Between Copper and Silicon: Failure Mechanism and Effect of Nitrogen Additions; Karen Holloway, et al.; J. Appl. Phys. 71 ⌒11, Jun. 1, 1992, pp. 5433–5444.

Base Electrodes for High Dielectric Constant Oxide Materials in Silicon Technology A. Grill, et al.; J. Mater. Res., vol. 7, No. 12, Dec. 1992, pp. 3260–3265.

Primary Examiner—Mahshid D. Saadat
Assistant Examiner—Alice W. Tang
Attorney, Agent, or Firm—Barnes, Kisselle, Raisch, Choate, Whittemore & Hulbert P.C.

[57] ABSTRACT

The use of a bi-layer thin film structure consisting of aluminum or aluminide on a refractory metal layer as a diffusion barrier to oxygen penetration at high temperatures for preventing the electrical and mechanical degradation of the refractory metal for use in applications such as a capacitor electrode for high dielectric constant materials.

19 Claims, 4 Drawing Sheets

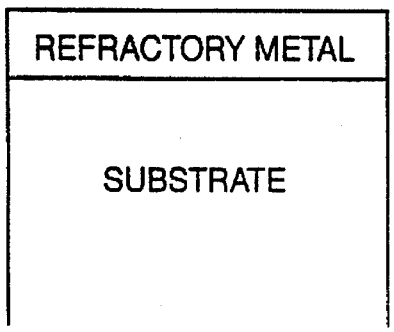
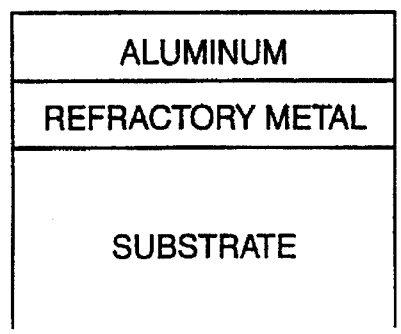
(PRIOR ART)
FIG.1A
FIG.1B
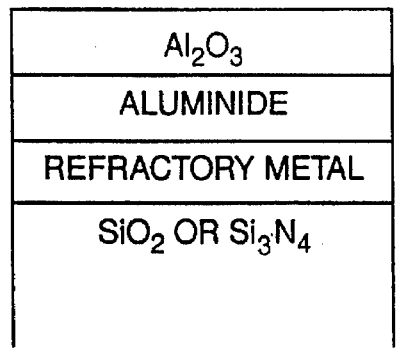
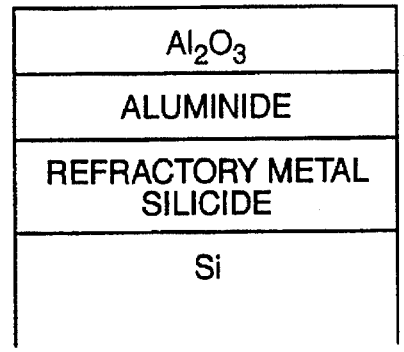
FIG.1C
FIG.1D
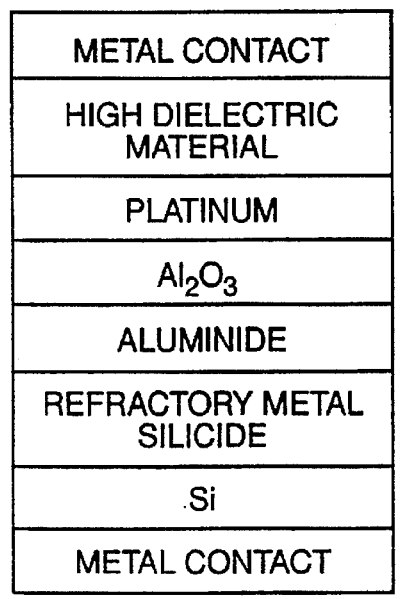
FIG.5

AS DEPOSITED

THIN FILM MULTI-LAYER OXYGEN DIFFUSION BARRIER CONSISTING OF REFRACTORY METAL, REFRACTORY METAL ALUMINIDE, AND ALUMINUM OXIDE

FIELD OF THE INVENTION

The present invention generally relates to a semiconductor structure that has a semiconductor base layer, a refractory metal layer deposited on top of the semiconductor base layer and an aluminum layer deposited on top of the refractory metal layer and a method of making the same and more particularly, relates to a semiconductor structure that has a silicon base layer, a refractory metal layer deposited on top of the silicon base layer and an aluminum layer deposited on top of the refractory metal layer whereby the latter two layers function as a diffusion barrier for oxygen to protect the semiconductor base layer from oxidation by the formation of an aluminum oxide layer on the surface of the aluminum and a method of making the same.

BACKGROUND OF THE INVENTION

Refractory metals such as tantalum and titanium have been used as diffusion barriers, adhesion layers or X-ray lithography masks in electronic applications. Unfortunately, these materials oxidize easily when annealed causing reliability problems due to the increased resistivity and stress. Other refractory metals such as Nb, V, Zr, Hf, Cr, Mo and W also oxidize easily in annealing ambients containing minimal amounts of oxygen and at relatively low temperatures. It is an expensive and difficult process to remove all oxygen from an annealing environment and some processes actually require an oxidizing ambient. Small amounts of oxygen incorporated interstitially in the refractory metals can cause large increases in compressive stress. For instance, in a Ta film that has 10% oxygen incorporation, an increase of 4 to 5 GPa in compressive stress and an increase of 63 $\mu\Omega$-cm in resistivity have been observed. When used in electronic applications, such increases in resistivity and stress can cause major reliability problems such as poor contact resistance, peeling and cracking.

Other researchers have utilized refractory metals in electronic applications as diffusion barriers, i.e., Ta diffusion barrier between Si and Cu was used by Holloway, et al., J. Appl. Phys., 71 (11), 5433 (1992). The use of Ta diffusion barrier between a high dielectric material and Si in the fabrication of a high dielectric oxide material has been shown in Grill, et al., J. Mater. Res., 7 (12), 3260 (1992). In the latter work, the fabrication of high dielectric constant oxide materials requires high temperature processing (>650° C.) in oxygen ambients which generally cause the underlying Si to oxidize, and thus creating an additional in-series low dielectric capacitor.

Other diffusion barrier materials such as TiN, WN and TaN have been used in VLSI applications, i.e., in contact holes for separating conductors from underlying silicon. However, these materials are not suitable oxygen diffusion barriers because they cannot withstand oxidation anneal cycles that the devices may be subjected to. In addition, other researchers have investigated elemental metals such as Pt, Au and Ru for the prevention of diffusion of oxygen to the underlying layer of silicon and its subsequent oxidation. It was found that none of the pure metals prevented the diffusion and the resulting $SiO_2$ formation. A break in the electrical conduction path to the silicon substrate occurred as a result.

In certain semiconductor processes, high dielectric constant Perovskite compounds (such as PZT, PLZT or $Ba_xSr_{1-x}TiO_3$) are deposited onto a substrate. These materials require high temperature (>650° C.) oxygen anneal in order to crystallize. It also requires a Pt seed layer for crystallization into a Perovskite phase which has the highest dielectric constant, i.e., 380 vs. about 40. For simple process integration, it is desirable to use Si as the lower electrode. A problem thus incurred during an oxygen anneal of the Perovskite compound/Pt/Si structure is the formation of an $SiO_2$ layer at the Pt/Si interface which reduces the effective dielectric constant. A diffusion barrier layer is therefore needed for preventing oxygen diffusion down to the Si layer, and also for preventing the Si diffusion up to the Pt layer.

It is therefore an object of the present invention to provide a diffusion barrier for use in a semiconductor device that does not have the shortcomings of the prior art diffusion barriers.

It is another object of the present invention to provide a diffusion barrier that can be fabricated in a simple manufacturing process.

It is a further object of the present invention to provide a diffusion barrier that is capable of sustaining the high processing temperatures encountered in semiconductor processing steps.

It is another further object of the present invention to provide an oxygen diffusion barrier for devices incorporating high dielectric constant oxide layers.

It is yet another object of the present invention to provide an oxygen diffusion barrier of a multi-layer aluminum/refractory metal material such that the refractory metal layer does not oxidize (remains electrically conducting) in a subsequent annealing step.

It is still another object of the present invention to provide an oxygen diffusion barrier that is a multi-layer thin film of aluminum/refractory metal such that when the film is exposed to atmosphere a thin layer of $Al_2O_3$ forms on the surface of aluminum.

SUMMARY OF THE INVENTION

The present invention provides a bi-layer thin film structure consisting of aluminum on a refractory metal layer that can be used as a diffusion barrier to oxygen penetration at high temperatures and thus preventing the electrical and mechanical degradation of the refractory metal.

In a preferred embodiment, the present invention utilizes a thin aluminum layer on top of a refractory metal layer as a diffusion barrier which can withstand high temperature annealing (>650° C.) and prevent oxygen diffusion. The layer structure of the diffusion barrier is $Al_2O_3$/refractory metal aluminide/refractory metal silicide/Si. The use of a thin film of aluminum on a refractory metal such as Ta, Ti, Nb, V, Zr, Hf, Cr, Mo, or W, in particular, aluminum on tantalum, reacts on annealing to form an effective diffusion barrier against oxygen penetration during high temperature annealing. As soon as the deposited bi-layer is exposed to the atmosphere, a thin layer of less than 5 nm of $Al_2O_3$ forms on the surface of the aluminum. During annealing, the excess metallic Al reacts with the Ta at temperatures higher than 400° C. to form a high melting point (>1000° C.) intermetallic. This is desirable since pure aluminum melts at 660° C. Thus, the final diffusion barrier structure after annealing consists of $Al_2O_3$ on $Al_3Ta$ on Ta or $TaSi_2$, when the diffusion barrier is in contact with Si. This final layer structure can withstand high temperature oxidation annealing in excess of 650° C.

BRIEF DESCRIPTION OF THE DRAWINGS

Other objects, features and advantages of the present invention will become apparent upon consideration of the specification and the appended drawings, in which:

FIGS. 1A–1D are enlarged cross-sectional views of the layer structures of a prior art and the present invention.

FIG. 5 is an enlarged cross-sectional view of a final capacitor structure using the Al/refractory metal oxygen diffusion barrier after a RTO anneal.

DETAILED DESCRIPTION OF THE PREFERRED EMBODIMENT

Figure 2A:
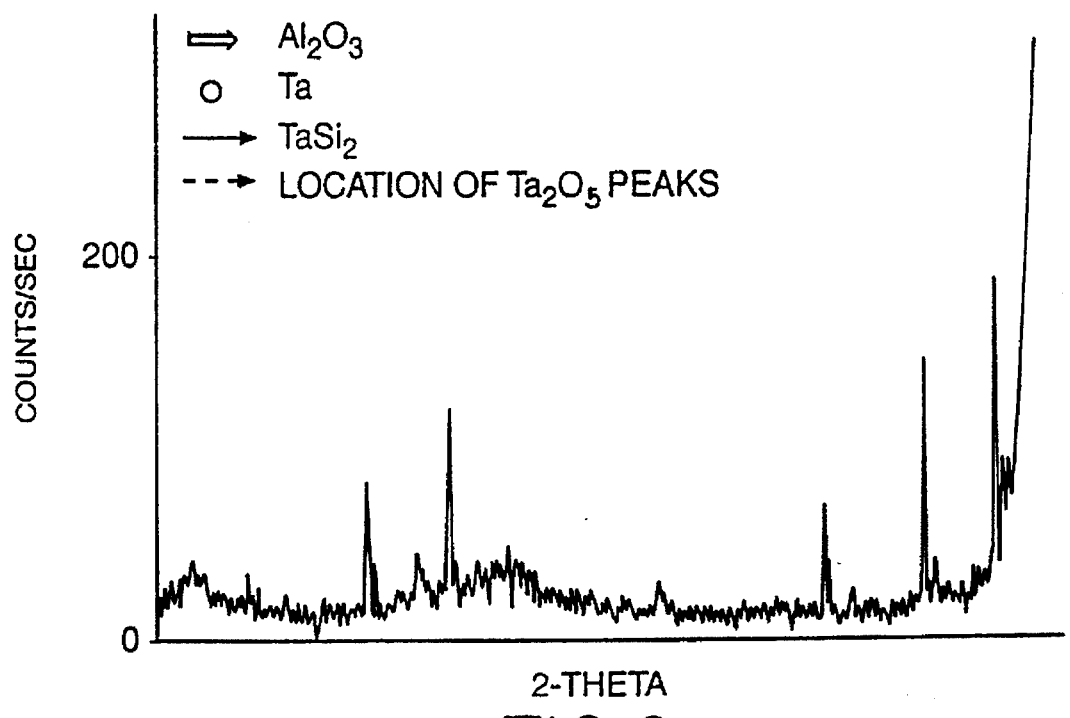
FIGS. 2A–2B are graphs illustrating X-ray diffraction traces of as deposited Al/Ta on Si and annealed Al/Ta on Si.

In accordance with the present invention, a thin aluminum layer deposited on a refractory metal diffusion barrier in a structure of $Al_2O_3$/aluminide/refractory metal silicide/Si is used to withstand a high temperature annealing of greater than 650° C. and to prevent oxygen diffusion.

A thin film of aluminum can be used on a variety of refractory metal films, such as Ta, Ti, Nb, V, Zr, Hf, Cr, Mo or W. In the preferred embodiment, an aluminum film deposited on a tantalum film which reacts to form an aluminide can be used as a diffusion barrier layer against oxygen penetration during a high temperature annealing process.

Referring initially to FIG. 1A, wherein a prior art diffusion barrier of a refractory metal layer 12 deposited on a substrate 14 is shown. FIG. 1B shows a present invention oxygen diffusion barrier arrangement wherein an aluminum film 16 is deposited on top of a refractory metal layer 18 which is in turn deposited on top of a substrate 20. As soon as the as deposited aluminum film 16 shown in FIG. 1B is exposed to atmosphere, a thin layer 22 of $Al_2O_3$ forms on the surface. This is shown in FIG. 1C. During a high temperature annealing, the excess metallic Al reacts with Ta at temperatures higher than 400° C. to form a layer of high melting point (>1000° C.) intermetallic of tantalum aluminide. This is shown in FIG. 1C as layer 24. FIG. 1C depicts the preferred embodiment in a X-ray lithography mask application where a $SiO_2$ or $Si_3N_4$ substrate is used. Thus, the final diffusion barrier structure after annealing consists of $Al_2O_3$ on $Al_3Ta$, i.e., layer 24 in FIG. 1C, on Ta or $TaSi_2$, i.e., layer 26 in FIG. 1D, when the diffusion barrier is in contact with Si as would be the case in a capacitor structure. This final structure can withstand high temperature oxidation annealing at higher than 650° C.

EXAMPLE 1

To evaluate an aluminum on refractory metal thin film bi-layer for use as an oxygen diffusion barrier, an aluminum film of 15 nm is first deposited on 50 nm of Ta using the physical vapor deposition technique of evaporation. Samples were annealed in an oxidation furnace at 650° C. for 30 min and in a Flexus F2400 thin film stress profiler system.

Figure 2B:
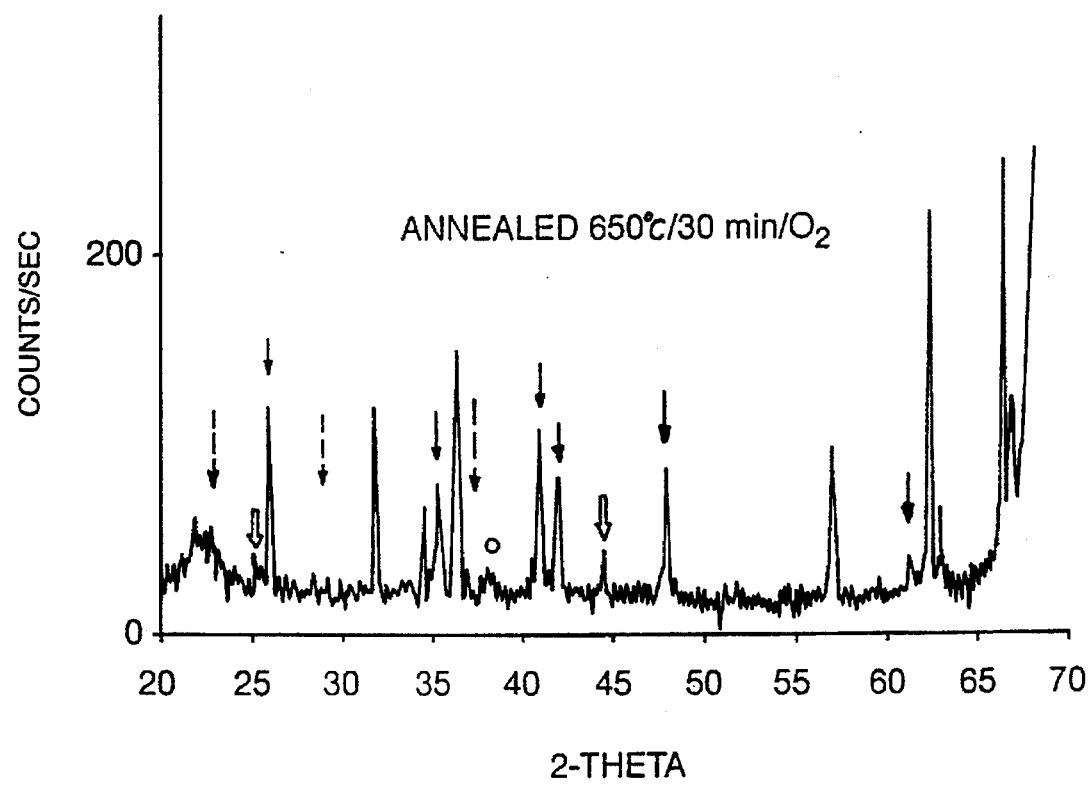

X-ray diffraction traces of an as deposited Al/Ta film on Si and an annealed Al/Ta film on Si are shown in FIGS. 2A–2B. The annealing conditions used were 650° C. for 30 min in $O_2$. The as deposited X-ray diffraction plot of the Al/Ta/Si film shows peaks for Al, Ta and the Si substrate. The graph for the annealed sample ($Al_2O_3$/$Al_3Ta$/$TaSi_2$/Si) shows the $Al_2O_3$, Ta and $TaSi_2$ peaks. The location of the peaks are marked. Also marked are the location of $Ta_2O_3$ peaks which are not present in the annealed sample indicating no $Ta_2O_3$ formation.

Figure 3A:
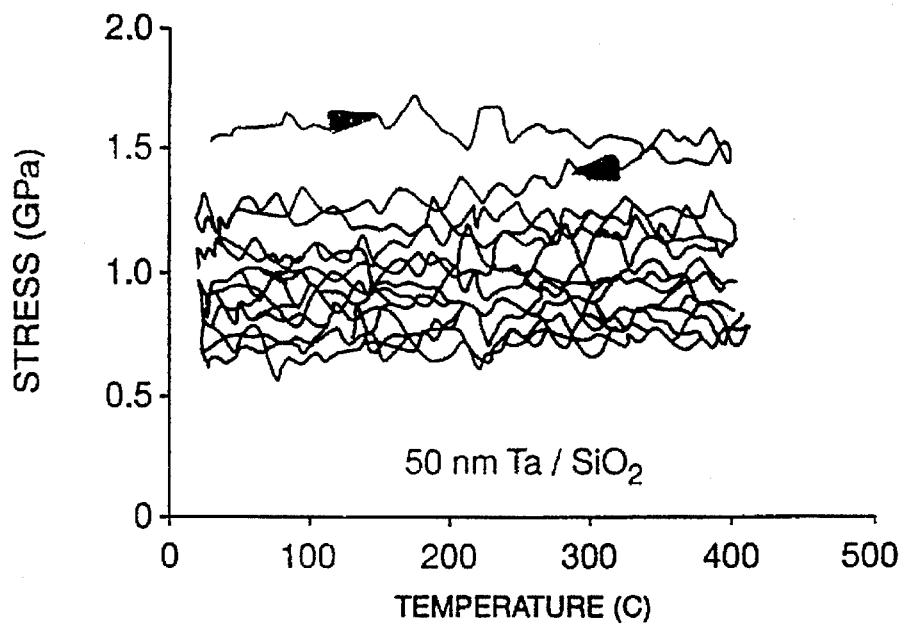
FIGS. 3A–3B are graphs illustrating stress as a function of temperature for a pure Ta film on an $SiO_2$ substrate and for a Al/Ta film on an identical $SiO_2$ substrate.
Figure 3B:
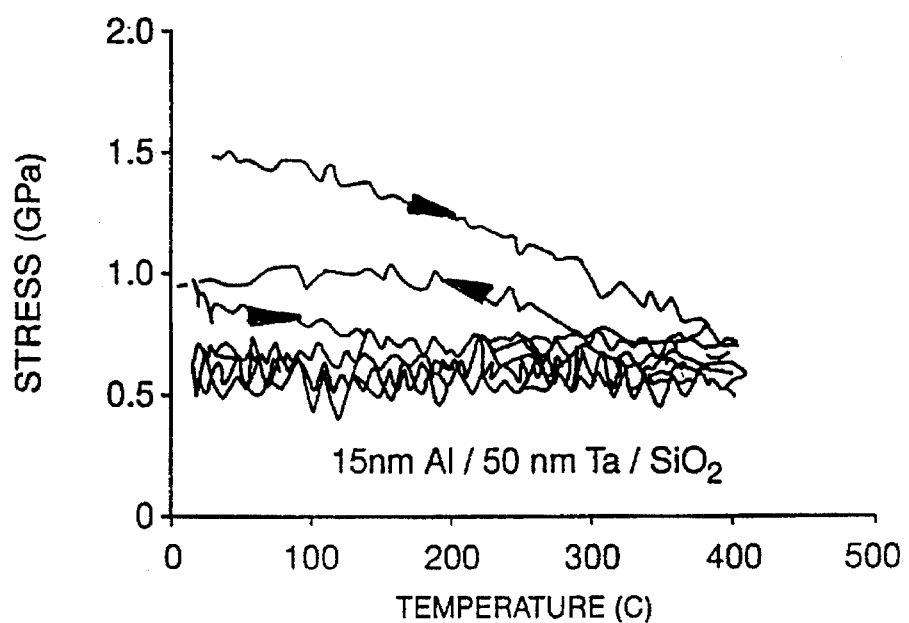

Graphs of stress plotted as a function of temperature for a pure Ta film on an $SiO_2$ substrate and for a Al/Ta film on an identical $SiO_2$ substrate are shown in FIGS. 3A–3B. In the case of the pure Ta film on an $SiO_2$ substrate, there is a continuous change in stress with thermal cycling due to oxygen incorporation. The thermal cycling was conducted at 10° C./min to 400° C. seven times in He/$O_2$. On the contrary, in the Al/Ta film deposited on the $SiO_2$ substrate, the stress remains constant after the second thermal cycle upon the complete formation of the $Al_3Ta$ phase. The X-ray diffraction curves and the stress analysis curves shown in FIGS. 2A–2B and 3A–3B therefore clearly prove the effectiveness of the Al/Ta bi-layer as a diffusion barrier to oxygen penetration at high temperatures.

Figure 4A:
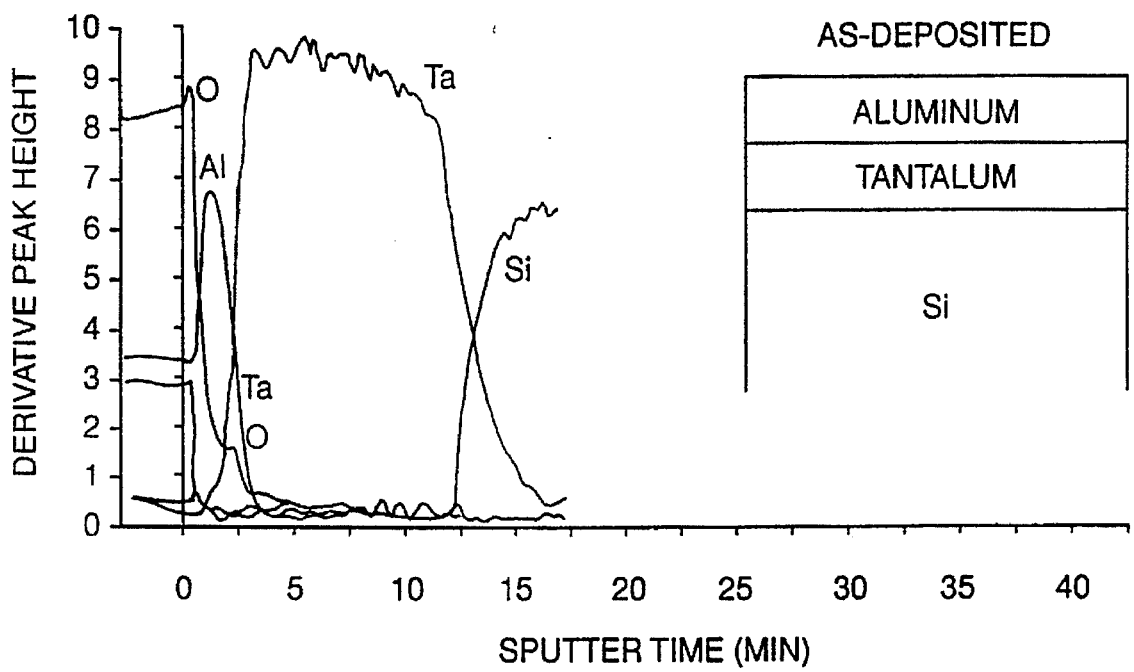
FIGS. 4A and 4B are graphs illustrating an Auger analysis peak height vs. sputter time for an as deposited Al/Ta on Si film and for an Al/Ta on Si film after annealing in oxygen for one minute at 700° C.
Figure 4B:
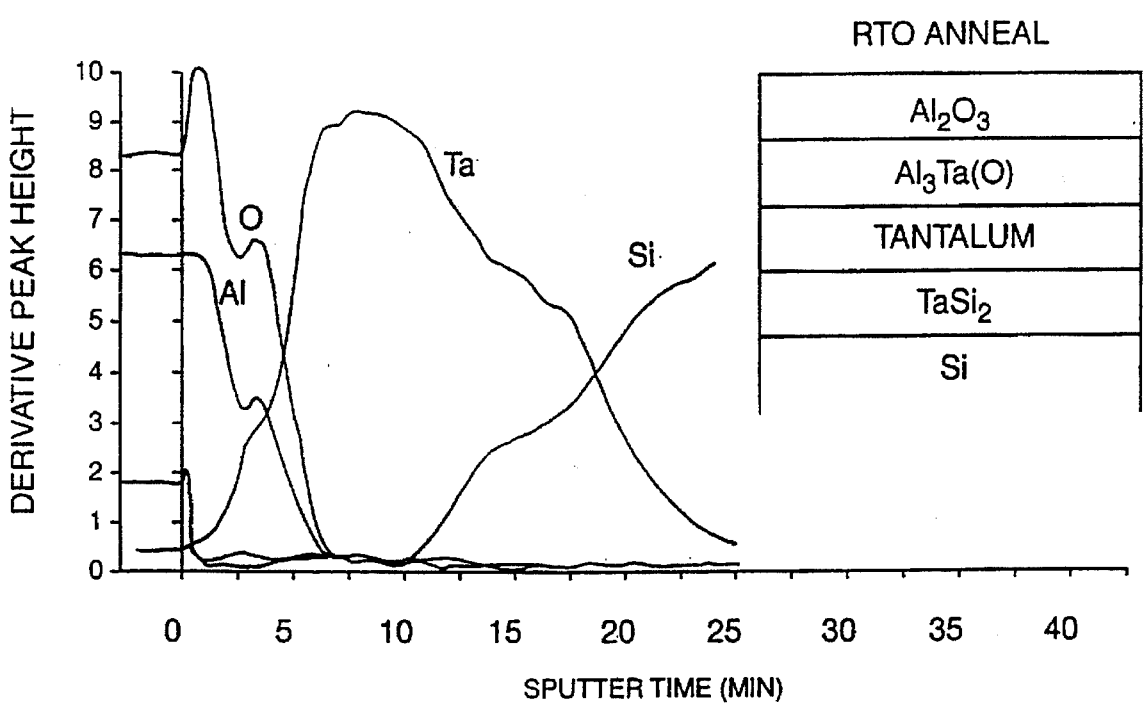

FIGS. 4A and 4B show graphs of Auger analysis peak height vs. sputter time (min) for an as deposited 15 nm Al on 50 nm Ta on Si film and for the same film annealed in oxygen for 1 min at 700° C. (by RTO, or rapid thermal oxidation anneal). During the Auger analysis, Al, Ta, Si, $O_2$ and Cl were monitored. The Cl was monitored to determine surface contamination. FIG. 4A shows data that verifies the structure of the as deposited sample of approximately 15 nm Al on 50 nm Ta on Si with a thin $Al_2O_3$ surface layer formed when the film was exposed to atmosphere. The film as all other films utilized in the present invention were deposited in an Airco FC3200 e-beam evaporation system with a base pressure between 1 and $2 \times 10^7$ Torr. The Al was deposited at a rate of 4 Å/sec and Ta at a rate of 2.5 Å/sec.

The graph shown in FIG. 4B reveals that after a 700° C., 1 min RTO anneal, the structure consists of a top $Al_2O_3$ layer thicker than in the as deposited case, and an underlying $Al_3Ta(O)$ layer, followed by a Ta layer and a $TaSi_2$ layer in contact with the Si substrate. It is observed that the Ta layer shows no evidence of oxidation indicating the structure is a diffusion barrier to oxygen penetration at 700° C. for 1 min. This is the temperature and time needed to crystallize the PLT (a high dielectric material) into the phase with the highest dielectric constant. The Auger results agree with the X-ray diffraction analysis and stress as a function of temperature analysis conducted on various samples in the present invention.

FIG. 5 shows a final capacitor structure incorporating the Al/refractory metal oxygen diffusion barrier after a RTO anneal. For the specific case where the refractory metal is tantalum and the high dielectric material is PLT, the measured dielectric constant between the top metal contact (i.e., Al) and the platinum layer is 380±10% and the dielectric constant measured between the top and bottom metal contact was also 380±10%. This is a clear indication that there is no continuous insulating oxide layer formed in the electrode structure during oxidation which would have caused a lowering of the dielectric constant due to a series capacitance effect.

The present invention can be used in any VLSI electronic application which involves the use of a refractory metal that may be oxidized during annealing causing a degradation of the material. In particular as diffusion barriers, adhesion layers, X-ray lithography masks, metal gate lines, metal contacts and electrode materials for high dielectric material formation applications.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiments of the invention in which an exclusive property or privilege is claimed are defined as follows.

We claim:

1. A multilayer diffusion barrier comprising:

a conducting substrate, a layer of a refractory metal overlying said substrate, a layer of refractory metal aluminide overlying said refractory metal layer, and an aluminum oxide layer overlying said refractory metal aluminide layer.

2. A multilayer diffusion barrier according to claim 1, wherein said conducting substrate is semiconducting.

3. A multilayer diffusion barrier according to claim 1, wherein said refractory metal is a member selected from the group consisting of Ta, Ti, Nb, V, Zr, Hf, Cr, Mo and W.

4. A multilayer diffusion barrier according to claim 1, wherein said refractory metal is a refractory metal silicide.

5. A multilayer diffusion barrier according to claim 1, wherein said conducting substrate is made of a material selected from the group consisting of single crystal silicon, polycrystalline silicon and amorphous silicon.

6. A multilayer diffusion barrier according to claim 1, wherein the refractory metal and the refractory metal aluminide are deposited by a physical vapor deposition technique, a chemical vapor deposition technique or an electroplating technique.

7. A multilayer diffusion barrier according to claim 1, wherein the refractory metal layer and the refractory metal aluminide layer have an annealed structure obtained after annealing at temperatures above 250° C.

8. A multilayer diffusion barrier according to claim 1, wherein said multilayer diffusion barrier has an annealed structure obtained after annealing in oxygen at temperatures between 400° C. and 800° C.

9. A capacitor comprising:

a conducting substrate, a layer of a refractory metal or a refractory metal silicide overlying said substrate, a layer of refractory metal aluminide overlying said refractory metal or said refractory metal silicide layer, and a layer of aluminum oxide overlying said refractory metal aluminide layer.

10. A capacitor comprising:

a conducting substrate, a layer of a refractory metal overlying said substrate, a layer of refractory metal aluminide overlying said refractory metal layer, an aluminum oxide layer overlying said refractory metal aluminide layer, a metal contact seed layer, a layer of a high dielectric constant material, and a top electrode layer.

11. A capacitor according to claim 10, wherein said conducting substrate is semiconducting.

12. A capacitor according to claim 10, wherein said refractory metal is a member selected from the group consisting of Ta, Ti, Nb, V, Zr, Hf, Cr, Mo and W.

13. A capacitor according to claim 10, wherein said metal contact seed layer is formed of a material selected from the group consisting of Pt, Pd, Ir and Au on which the high dielectric constant layer is deposited.

14. A capacitor according to claim 10 wherein said refractory metal is a refractory metal silicide.

15. A capacitor according to claim 10, wherein said conducting substrate is made of a material selected from the group consisting of single crystal silicon, polycrystalline silicon and amorphous silicon.

16. A capacitor according to claim 10, wherein the refractory metal and the refractory metal aluminide are deposited by a physical vapor deposition technique, a chemical vapor deposition technique or an electroplating technique.

17. A capacitor according to claim 10, wherein the refractory metal layer and the refractory metal aluminide layer have an annealed structure obtained after annealing in He, Ar, $N_2$, FG or $O_2$ at temperatures above 250° C.

18. A capacitor according to claim 10, wherein said high dielectric constant material is a Perovskite compound selected from the group consisting of PZT, PLZT and $Ba_xSr_{1-x}TiO_3$.

19. A capacitor according to claim 11, wherein the high dielectric constant material the layer of refractory metal, and the layer of refractory metal alumninide deposited on the conducting substrate, having an annealed structure obtained after annealing in oxygen at a temperature between 400° C. and 800° C.

* * * * *